(12) United States Patent
Ree et al.

(10) Patent No.: US 8,981,353 B2
(45) Date of Patent: Mar. 17, 2015

(54) PHOTOCROSSLINKABLE POLYIMIDE POLYMER, MANUFACTURING METHODS FOR THE SAME MEMORY DEVICES USING THE SAME

(75) Inventors: Moonhor Ree, Gyungbuk (KR); Samdae Park, Gyungbuk (KR); Suk Gyu Ham, Gyungbuk (KR); Jin Chul Kim, Gyungbuk (KR); Yong-gi Ko, Gyeonggi-do (KR); Jun Man Choi, Busan (KR); Taek Joon Lee, Seoul (KR); Dong Min Kim, Busan (KR); Kyungtae Kim, Gyungbuk (KR); Wonsang Kwon, Chungbuk (KR)

(73) Assignee: Postech Academy-Industry Foundation, Gyungbuk (KR)

( * ) Notice: Subject to any disclaimer, the term of this patent is extended or adjusted under 35 U.S.C. 154(b) by 226 days.

(21) Appl. No.: 13/639,530

(22) PCT Filed: Mar. 31, 2011

(86) PCT No.: PCT/KR2011/002253
§ 371 (c)(1),
(2), (4) Date: Nov. 5, 2012

(87) PCT Pub. No.: WO2011/126235
PCT Pub. Date: Oct. 13, 2011

(65) Prior Publication Data
US 2013/0140532 A1 Jun. 6, 2013

(30) Foreign Application Priority Data
Apr. 7, 2010 (KR) .................. 10-2010-0031604

(51) Int. Cl.
*H01L 35/24* (2006.01)
*H01L 51/00* (2006.01)
(Continued)

(52) U.S. Cl.
CPC .......... *H01L 51/0035* (2013.01); *C08G 73/101* (2013.01); *G11C 13/0016* (2013.01);
(Continued)

(58) Field of Classification Search
USPC ............................................ 257/40, E51.001
See application file for complete search history.

(56) References Cited

U.S. PATENT DOCUMENTS 3,959,350 A 5/1976 Rogers
6,303,742 B1 10/2001 Okada et al.
(Continued)

FOREIGN PATENT DOCUMENTS

JP 2000-256462 9/2000
KR 20030016981 3/2003

OTHER PUBLICATIONS

PCT, International Search Report, PCT/KR2011/002253 (mailed Dec. 23, 2011), 2 pages.
(Continued)

*Primary Examiner* — Anthony Ho
(74) *Attorney, Agent, or Firm* — Thompson Hine LLP

(57) ABSTRACT

The present invention relates to a polymer memory device and to a production method for the same, and relates to a novel photocrosslinkable polymer compound able to be used in a polymer memory device, to a novel non-volatile memory device in which an active layer between an upper electrode and a lower electrode comprises a photocrosslinkable polyimide polymer, and to a production method for the same. In the polymer memory device, the photocrosslinkable polyimide polymer is used as an active layer.

18 Claims, 2 Drawing Sheets

(51) Int. Cl.
*C08G 73/10* (2006.01)
*G11C 13/00* (2006.01)
*H01L 51/05* (2006.01)
*G11C 13/04* (2006.01)

(52) U.S. Cl.
CPC ........ *H01L51/0002* (2013.01); *H01L 51/0591* (2013.01); *G11C 13/04* (2013.01); *G11C 2213/15* (2013.01); *G11C 2213/72* (2013.01); *H01L 51/0595* (2013.01)
USPC ................ 257/40; 257/E51.001; 438/99

(56) References Cited

U.S. PATENT DOCUMENTS 6,307,002 B1  10/2001  Okada et al.
6,737,502 B2   5/2004  Jong

OTHER PUBLICATIONS

Lai et al., "Bistable resistance switching of poly(N-vinylcarbazole) films for nonvolatile memory applications," Applied Physics Letters, 87, 122101-1, 122101-2, 122101-3 (2005).
Majumdar et al, "Switching and memory devices based on a polythiophene derivative for data-storage applications," Synthetic Metals, 140 (2004) 203-206.
Tseng et al., "Polyaniline Nanofiber/Gold Nanoparticle Nonvolatile Memory," Nano Letters, vol. 5, No. 6 1077-1080 (2005).
Groves et al., "Switching the polyacetylene soliton", Materials Science and Engineering: C3 (1995), 181-185.
Extended European Search Report 11766086.0, mailed Jun. 13, 2014 (5 pages).
Communication due date to respond to Extended European Search Report, mailed Jul. 1, 2014 (1 page).

PHOTOCROSSLINKABLE POLYIMIDE POLYMER, MANUFACTURING METHODS FOR THE SAME MEMORY DEVICES USING THE SAME

TECHNICAL FIELD

The present invention relates to a polymer memory device and a manufacturing method thereof, and, more particularly, to a novel photocrosslinkable polymer compound, a nonvolatile memory device having an active layer including a photocrosslinkable polyimide polymer placed between an upper electrode and a lower electrode, and a manufacturing method thereof.

BACKGROUND ART

Recently, as various digital media, such as smart cards, portable terminals, electronic cashes, digital cameras, game memory, MP3 players and the like have been increasingly used, the amount of information to be processed and stored has increased rapidly, and thus the demand for various kinds of memory devices has also increased rapidly. Further, as technologies for processing a large amount of information at high speed have been increasingly required, there has been much research effort into the development of next-generation memory devices. Next-generation memory devices must process an ultra-large amount of information at high speed at low power consumption, and must be nonvolatile memory devices in which the recorded information does not disappear even after power has been turned off. To date, most research into nonvolatile memories has been done into silicon-based flash memories, but silicon-based flash memories involve some basic limitations. For example, conventional flash memories are confronted with such limitations as the number of times that recording and removing can be done is limited, the recording speed is slow, the manufacturing cost of a memory chip increases due to a miniaturization process for obtaining highly-integrated memory capacity, and a chip cannot be miniaturized any more due to physical characteristics.

As such, as conventional flash memory technologies are reaching their limits, research into replacing conventional silicon memory devices is being actively done. Next-generation memories are classified into ferroelectric memories, ferromagnetic memories, phase-change memories, nanotube memories, holographic memories, organic memories, polymer memories and the like according to the material constituting a cell which is a basic unit in a semiconductor. Among these memories, a polymer memory realizes memory characteristics by forming a memory layer between upper and lower electrodes using an organic polymer material and then applying a voltage to the memory layer to provide bistability to the resistance value of the memory layer. Here, the cell formed at the place where upper and lower electrodes intersect each other provides bistability. That is, the polymer memory is a memory in which the resistance of the polymer material existing between upper and lower electrodes is reversibly changed by electrical signals to record and read the data "0" and "1". Such polymer memory is expected to become a next-generation memory that can realize nonvolatility, which is an advantage of conventional flash memories, and that can overcome the problems with processability, manufacturing cost and degree of integration, which are the disadvantages of conventional flash memories.

As examples of organic and polymer memories, US Patent Application Publication No. 2004-27849 proposes an organic memory device in which metal nanoclusters are applied between organic active layers, and Japanese Unexamined Patent Application Publication No. S62-95882 discloses an organic memory device in which CuTCNQ (7,7,8,8-tetracyano-p-quinodimethane) is used as an organometallic complex compound for charge transfer. However, these organic memory devices are problematic in that the manufacturing process thereof is complicated because organic active layers are formed by vacuum deposition, it is difficult to uniformly form metal nanoclusters in the device, the production yield thereof is low, and the manufacturing cost thereof increases. Meanwhile, in a nonvolatile memory device using a polymer, as the compound used to form the active layer, there are a polythiophene-based polymer compound, a polyacetylene-based polymer compound, a polyvinylcarbazole-based polymer compound and the like (refer to the documents [H. S. Majumdar, A. Bolognesi, and A. J. Pal, Synthetic metal 140, 203-206 (2004)]; [M. P. Groves, C. F. Carvalho, and R. H. Prager, Materials Science and Engineering C, 3(3), 181-183 (1995)]; and [Y.-S. Lai, C.-H., Tu and D.-L. Kwong, Applied Physics Letters, 87, 122101-122103 (2005)]).

Here, the polythiophene-based polymer compound is disadvantageous in that the voltage values representing ON/OFF states are high, this polymer compound is unstable in air, and the ratio of ON/OFF is not constant. Further, the polyacetylene-based polymer compound is problematic in that it is difficult to actually form this polymer compound into a memory device because this polymer compound is known as a conjugated polymer which is the most easily oxidized in the air, although it is possible for this polymer compound to be formed into a memory device. Further, it is reported that the polyvinylcarbazole-based polymer compound exhibits excellent switching characteristics, and, currently, research into the polyvinylcarbazole-based polymer compound is being actively done (refer to the document [Y.-S. Lai, C.-H., Tu and D.-L. Kwong, Applied Physics Letters, 87, 122101-122103 (2005)]). Meanwhile, polyaniline has also been used as a raw material of a memory device, but is problematic in that the solubility of polyaniline in an organic solvent is low (refer to the document [R. J. Tseng, J. Huang, J. Ouyang, R. B. Kaner, and Y. Yang, Nano Letters, 5, 1077-1080 (2005)]).

DISCLOSURE

Technical Problem

Accordingly, an object of the present invention is to provide an organic nonvolatile memory device which overcomes the above-mentioned problems, which has a simple manufacturing process, which causes a current-voltage switching phenomenon, which has a high ratio of ON/OFF, and which can preserve recorded information for a long period of time.

Another object of the present invention is to provide a novel polymer compound for a nonvolatile memory device, which can solve the above-mentioned problems.

Still another object of the present invention is to provide a method of preparing a novel polymer compound for a nonvolatile memory device, which can solve the above-mentioned problems.

Technical Solution

In order to accomplish the above objects, an aspect of the present invention provides a polyimide polymer compound, represented by Formula (I) below:

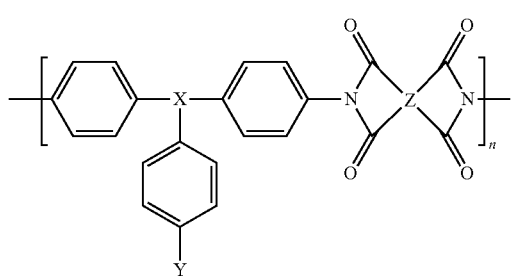

wherein X is —CH—, N or P, and Y is selected from the group consisting of the following derivatives:

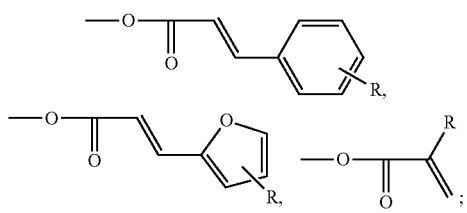

R is H or an alkyl group of 1 to 8 carbon atoms, and Z is any one selected from the group consisting of the following aromatic and aliphatic derivatives:

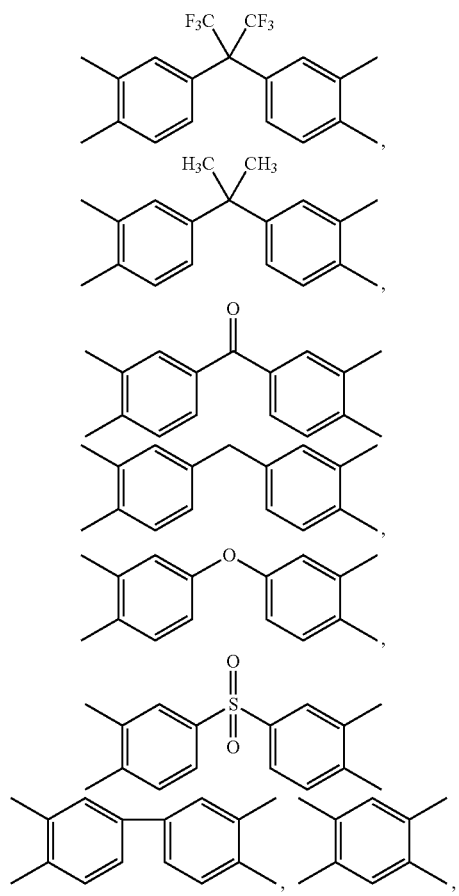

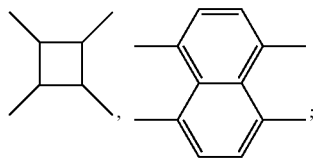

and n is a positive integer, and the polyimide polymer compound has a weight average molecular weight of 5,000 to 5,000,000.

The polyimide polymer compound of the present invention may be a photocrosslinkable polymer compound.

In an aspect of the present invention, the polyimide polymer compound represented by Formula (I) above is prepared by reacting a polymer compound represented by Formula (II) below with at least one selected from the following compounds (II-1):

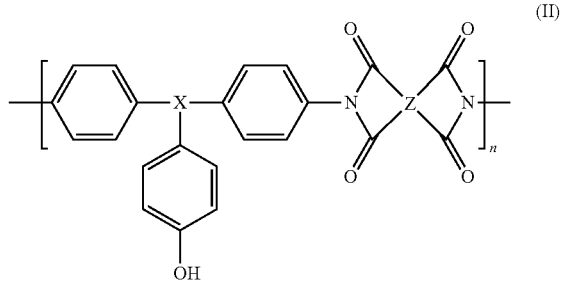

wherein X is —CH—, N or P, and Z is selected from the group consisting of the following aromatic and aliphatic derivatives:

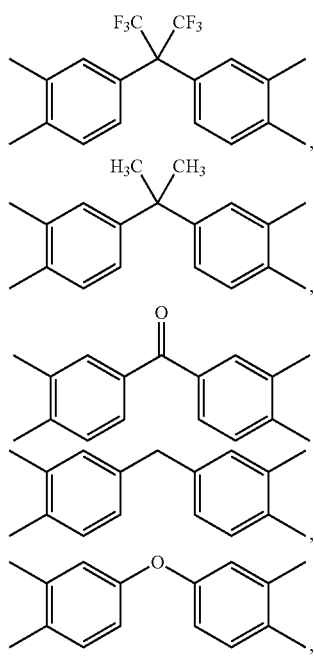

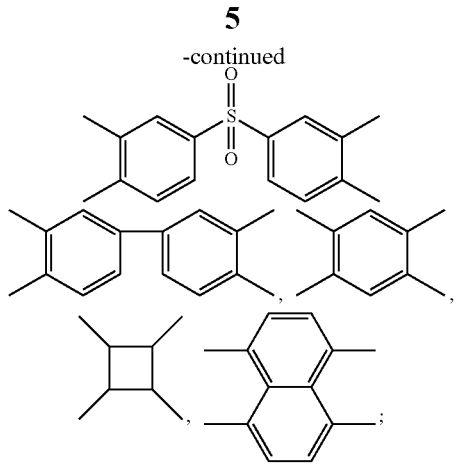

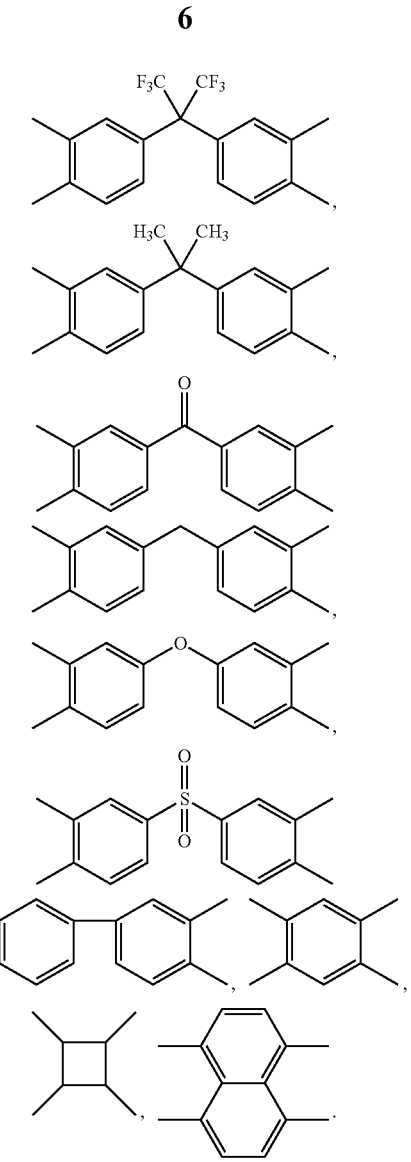

and n is a positive integer (repetitive unit) of 10 to 10000, and

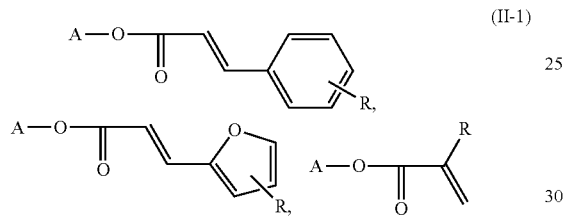
(II-1)

wherein R is hydrogen or an alkyl group of 1 to 8 carbon atoms, and A is halogen.

In an embodiment of the present invention, the polymer compound represented by Formula (II) above is prepared by reacting a compound represented by Formula (III) below with a compound represented by Formula (IV) below:

(III)

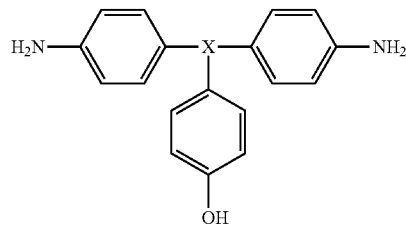
(IV)

wherein X is —CH—, N or P; and

Z is selected from the group consisting of the following aromatic and aliphatic derivatives:

In an embodiment of the present invention, the compound represented by Formula (IV) above may be obtained by a reduction reaction of a compound represented by Formula (V) in the presence of a palladium catalyst:

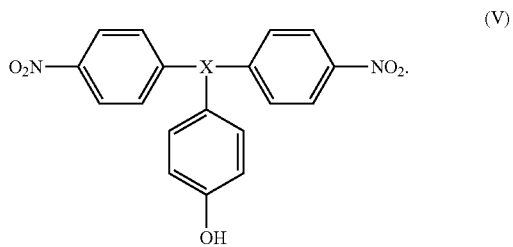
(V)

Further, the compound represented by Formula (V) above is prepared by reacting a compound represented by Formula (VI) with 4-fluoronitrobenzene under a cesium catalyst:

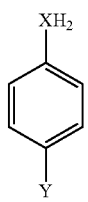 (VI)

wherein Y is selected from the group of the following derivatives

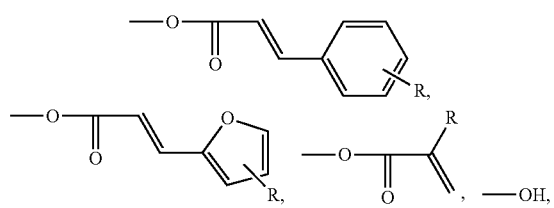, —OH,

Here, R is H or an alkyl group of 1 to 8 carbon atoms.

Another aspect of the present invention provides an organic memory device, including an active layer obtained by crosslinking a polyimide polymer represented by Formula (I):

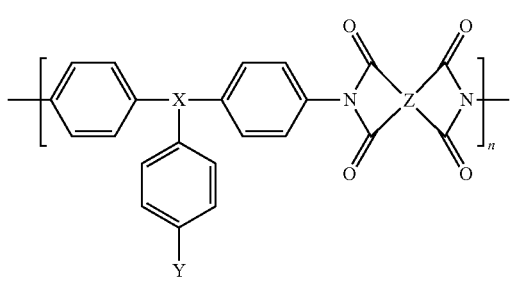 (I)

wherein X is —CH—, N or P, and Y is selected from the group consisting of the following derivatives:

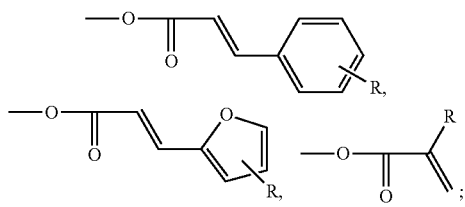

R is H or an alkyl group of 1 to 8 carbon atoms, and Z is any one selected from the group consisting of the following aromatic and aliphatic derivatives:

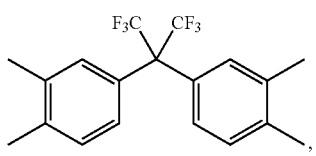

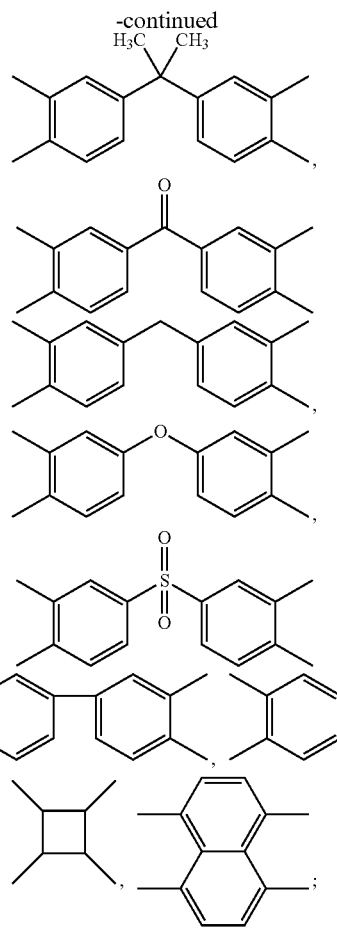

and n is a positive integer, and the polyimide polymer compound has a weight average molecular weight of 5,000 to 5,000,000, preferably, 5,000 to 500,000.

The organic memory device of the present invention includes a first electrode, an active layer formed on the first electrode, and a second electrode formed on the active layer.

The organic memory device of the present invention may include an active layer transporting electrons and holes between a lower electrode and an upper electrode. The active layer is made of a polyimide polymer. In this case, when a voltage applied to both ends of an electrode of the manufactured organic memory device, electrons and holes are introduced into the active layer by the electrode, and current is carried by the filament formed in the active layer.

The active layer of the organic memory device of the present invention is made of a polyimide polymer in the form of a film having a thickness of 10~100 nm. The method of manufacturing a polymer memory device includes the steps of: forming an active layer on a lower electrode formed on a substrate; and forming an upper electrode on the active layer such that the upper electrode is brought into contact with the active layer.

The organic memory device of the present invention may include an active layer transporting electrons and holes between a lower electrode and an upper electrode. In this case, when a voltage applied to both ends of an electrode of the manufactured organic memory device, electrons and holes are introduced into the active layer by the electrode, and current is carried by the filament formed in the active layer.

Further, when a voltage is applied to the organic memory device, the resistance value of the active layer becomes bistable, thus exhibiting memory characteristics. Further, since such memory characteristics are caused by the characteristics of an organic material, even when the power has been turned off, the memory characteristics are maintained, thus exhibiting the characteristics of a nonvolatile memory device.

In the organic memory device of the present invention, an active layer is formed in the form of a film, a light-shielding pattern is formed to pattern the active layer, the active layer is photocrosslinked by irradiating the active layer with light, and then the active layer, which was not photocrosslinked, is removed, thereby forming a pattern.

In the organic memory device of the present invention, the upper electrode may be selected from the group consisting of gold, silver, platinum, copper, cobalt, nickel, tin, aluminum, indium-tin oxide, titanium, and combinations thereof, and the lower electrode may be selected from the group consisting of gold, silver, platinum, copper, cobalt, nickel, tin, aluminum, indium-tin oxide, titanium, and combinations thereof. The active layer is connected to an electrode and a diode, and the diode may be a P—N diode or a Schottky diode.

The present invention provides a polyimide polymer compound represented by Formula (I') below, which is used as an active layer of a polymer memory device:

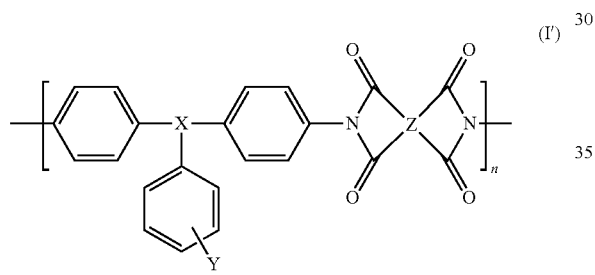

(I')

wherein X is —CH—, N or P, and Y is selected from the group consisting of the following derivatives:

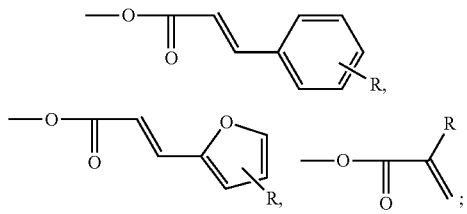

R is H or an alkyl group of 1 to 8 carbon atoms, and Z is any one selected from the group consisting of the following aromatic and aliphatic derivatives:

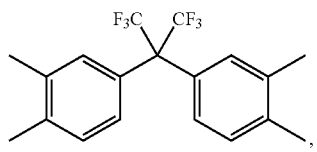

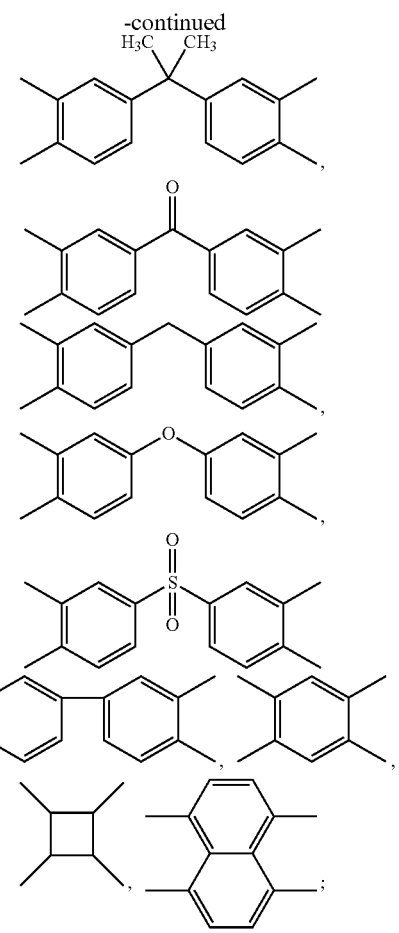

and n is a positive integer, and the polyimide polymer compound has a weight average molecular weight of 5,000 to 5,000,000, preferably 5,000 to 500,000.

Advantageous Effects

As described above, the novel polyimide polymer of the present invention, represented by Formula (I), has very excellent processability because it is soluble in an organic solvent, and has excellent mechanical properties such as thermal stability, mechanical strength, heat resistance, cold resistance and the like. Further, since the polyimide polymer has excellent electrical characteristics, a switching phenomenon occurs at a low driving voltage, and two current states of ON and OFF exist, so that a nonvolatile memory device can be realized by forming an active layer using the polyimide polymer. Further, since the polyimide polymer can be photocrosslinked, desired patterns can be freely realized using a mask. Therefore, when the photocrosslinkable polyimide polymer is used, a nonvolatile memory device having very excellent performance can be manufactured by a very simple process at low manufacturing cost.

BEST MODE

Hereinafter, the present invention will be described in detail with reference to the accompanying drawings.

Figure 1:
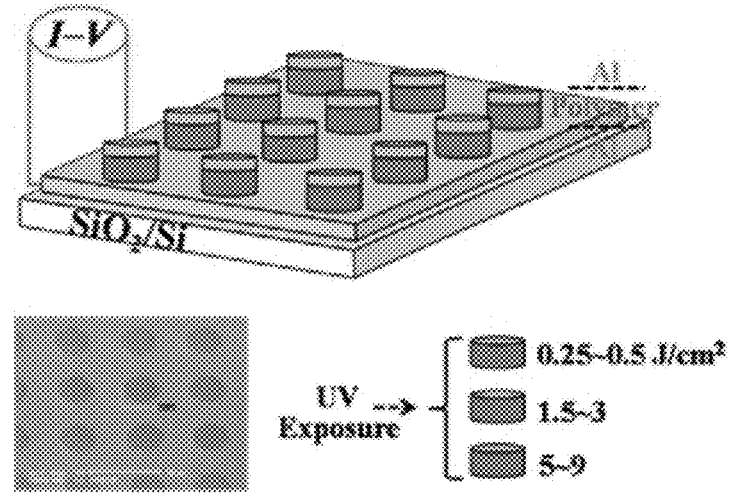
FIG. 1 is a schematic section view showing an organic memory device according to an embodiment of the present invention.

FIG. 1 is a schematic section view showing an organic memory device according to an embodiment of the present invention. Referring to FIG. 1, the organic memory device of the present invention includes an active layer sandwiched between a first electrode and a second electrode. When a voltage is applied to this organic memory device, the resistance value of the active layer becomes bistable, thus exhibiting memory characteristics. Further, since such memory characteristics are caused by the characteristics of an organic material, even when the power has been turned off, the memory characteristics are maintained, thus exhibiting the characteristics of a nonvolatile memory device.

Hereinafter, the present invention will be described in more detail with reference to the following Synthesis Examples. However, the present invention is not limited thereto.

Synthesis Example 1

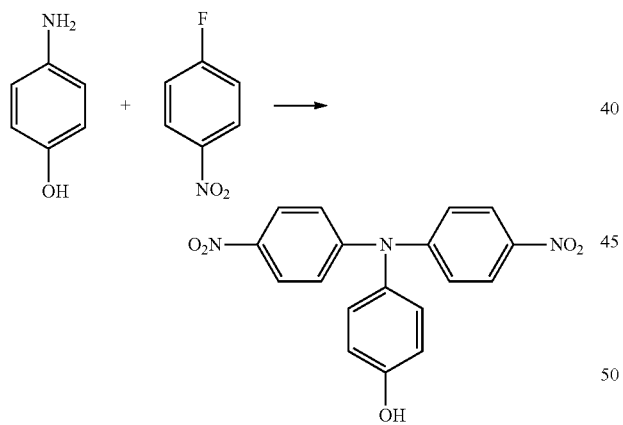

5 g (45.8 mmol) of 4-aminophenol, 7 g (45.8 mmol) of cesium fluoride and 30 mL of dimethylsulfoxide were introduced into a 250 mL round-bottom flask and then stirred. Subsequently, 13.57 g (96.18 mmol) of 4-fluoronitrobenzene were added to the mixture, and then stirred at 150 for 24 hours. The reactant mixture was precipitated in hot methanol, filtered and then cooled to room temperature to obtain a precipitate in a yield of 81%.

$^1$H-NMR (300 MHz, CDCl$_3$): δ(ppm)=9.34 (s, 1H, Ar—OH), 8.23-8.21 (d, 2H, Ar—H), 8.08-8.05 (d, 2H, Ar—H), 7.33-7.30 (d, 2H, Ar—H), 7.20-7.17 (d, 2H, Ar—H), 7.13-7.10 (d, 2H, Ar—H), 7.06-7.03 (d, 2H, Ar—H)

Synthesis Example 2

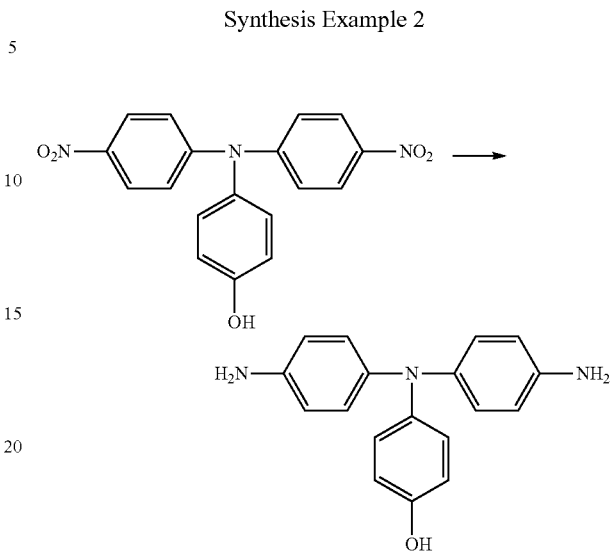

7.03 g (20 mmol) of the dinitro compound obtained in Synthesis Example 1, 2 g of Pd/C (5 wt %) and 100 mL of ethanol were introduced into a 250 mL round-bottom flask. Subsequently, 30 mL of hydrazine monohydrate (98%) was added to the mixture, and then stirred at 100 for 24 hours. Subsequently, the reactant mixture is filtered to remove Pd/C, and concentrated to obtain a reaction product in a yield of 84%.

$^1$H-NMR (300 MHz, CDCl$_3$): δ(ppm)=7.26 (s, 1H, Ar—OH), 6.78-6.64 (m, 8H, Ar—H), 6.53-6.48 (m, 4H, Ar—H), 4.75 (br, 4H, Ar—NH$_2$)

Synthesis Example 3

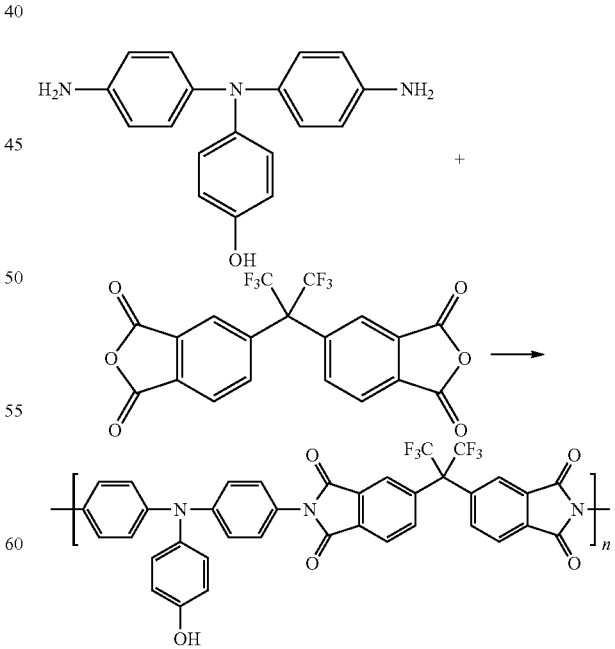

4.44 g (10 mmol) of 2,2-bis-(3,4-dicarboxylphenyl) hexafluoropropane dianhydride, 2.53 mL of isoquinoline and 80 mL of dimethylacetamide were introduced into a 250 mL round-bottom flask and then stirred at room temperature for 30 minutes. Subsequently, 2.91 g (10 mmol) of the diamine compound synthesized in Synthesis Example 2 were added to the mixture, stirred at 70 for 2 hours, and then stirred at 160 for 12 hours. The reactant mixture was dropped into methanol, and then a solvent is removed therefrom to obtain a polymer in a yield of 98%.

$^1$H-NMR (300 MHz, CDCl$_3$): (300 MHz, CDCl$_3$).δ(ppm): 8.39 (s, 1H, Ar—OH), 8.15-8.10 (t, 2H, Ar—H), 7.92 (br, 2H, Ar—H), 7.70 (s, 2H, Ar—H), 7.39-7.36 (d, 2H, Ar—H), 7.23-7.02 (m, 10H, Ar—H)

Synthesis Example 4

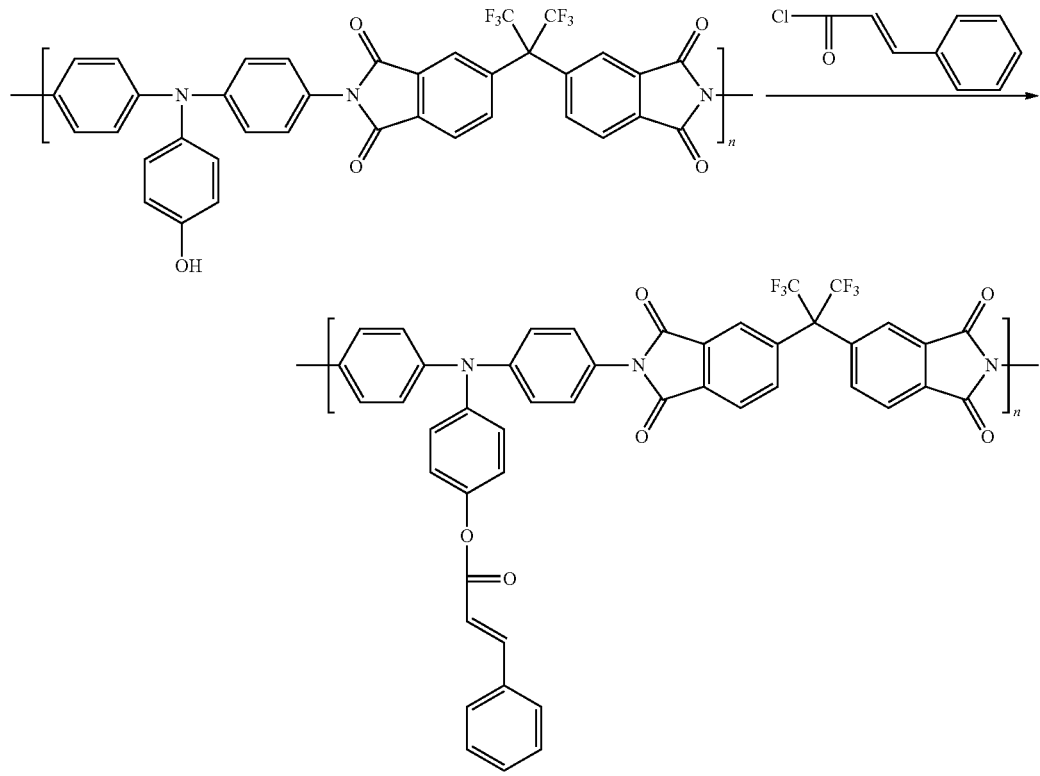

Polyimide (0.699 g, 1 mmol) obtained in Synthesis Example 3 and pyridine (0.475 g, 6 mmol) were dissolved in tetrahydrofuran (20 mL) and then cooled to 0. Subsequently, cinnamoyl chloride (0.592 g, 4 mmol) was added to the mixed solution, and then stirred at room temperature for 24 hours. The reactant mixture was dropped into methanol, and then a solvent is removed therefrom to obtain a polymer in a yield of 93%.

$^1$H-NMR (300 MHz, CDCl$_3$): (300 MHz, CDCl$_3$).δ(ppm): 8.16 (s, 2H, Ar—H), 7.95 (s, 2H, Ar—H), 7.75 (s, 2H, Ar—H), 7.66 (d, 1H, Ar—CH═C), 7.51-7.36 (m, 9H, Ar—H), 7.22-7.08 (m, 6H, Ar—H), 6.55 (d, 1H, OCO—CH═C)

Mode for Invention

In order to make the organic memory device shown in FIG. 1, an insulation film (SiO$_2$) was formed on a silicon substrate by thermal oxidation, and then an aluminum (Al) electrode having a thickness of 100~300 nm was formed on the insulation film using an electron beam or a thermal evaporator.

Subsequently, the polymer prepared in the Synthesis Example 4 was dissolved in a cyclopentanone solvent, and then the solution was filtered by a syringe filter having a pore size of 0.2 μm and then applied onto the aluminum (Al) electrode using spin coating to form a polymer active layer. Subsequently, the polymer active layer was heat-treated at 80 for 1 hour in a vacuum to form a thin film including the polymer active layer having a thickness of 20~80 nm on the aluminum (Al) electrode. In this case, the thickness of the polymer active layer was measured using an alpha-step profiler and elipsometry. Then, the polymer active layer formed in this way was covered with a photomask, irradiated with ultraviolet radiation of 7.5 J/cm$^3$ to be crosslinked, and then the noncrosslinked portion thereof was removed to pattern the polymer active layer. Finally, the aluminum (Al) electrode was deposited on the patterned polymer active layer to a thickness of 1~1000 nm using an electron beam or a thermal evaporator to manufacture an organic memory device. In this case, the thickness of the aluminum (Al) electrode deposited on the patterned polymer active layer was controlled by a quartz crystal monitor.

Experimental Example 1

Test of Characteristics of Memory Device

The electrical characteristics of the organic memory device obtained in Example 1 were measured using a probe station connected to a semiconductor analyzer. The switching characteristics thereof were evaluated by bringing a tungsten tip of the probe station into contact with electrodes located at both ends of a polymer active layer and applying a voltage to the electrodes to measure the change of current to applied voltage.

Figure 2:
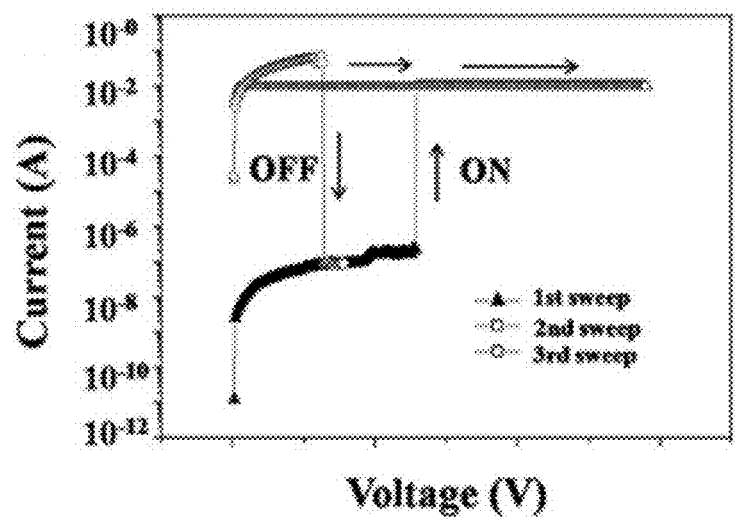
FIG. 2 is a graph showing the change of current to the positive voltage applied to a polymer memory device according to an embodiment of the present invention.
Figure 3:
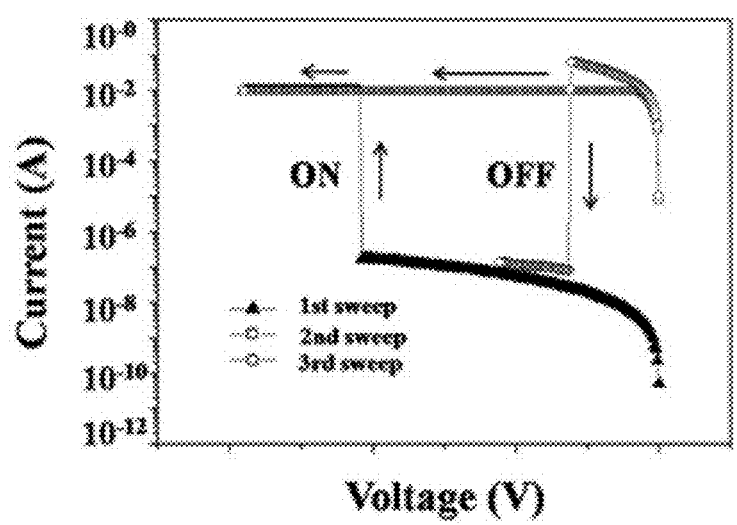
FIG. 3 is a graph showing the change of current to the negative voltage applied to a polymer memory device according to an embodiment of the present invention.

As shown in FIG. 2 which is a graph showing the current-voltage relationship of the organic memory device having the aluminum (Al) electrode, the memory device having an active layer made of a novel photocrosslinkable polyimide polymer according to the present invention exhibits the tendency that, when compliance current is 0.01 A, the memory device maintains a low current state and an Off state at a low voltage, and then the memory device turns on at a certain voltage (±1.5 V) to maintain a high current state and an On-state, and then the memory device stably maintains On-state even after a repetitive bidirectional sweep. Here, the phenomenon that the memory device turns on corresponds to the 'Write' phenomenon in the memory phenomena. When the compliance current is set to 0.1 A in a state in which the memory device becomes 'Write', the memory device exhibits the tendency that the memory device maintains an On state, and then the memory device turns off at a certain voltage (±0.5 V) to maintain a low current state and an Off-state, and then the memory device stably maintains the Off-state even after repetitive bidirectional sweep. Here, the phenomenon that the memory device turns off corresponds to the 'Erase' phenomenon in the memory phenomena. That is, this memory device can freely control 'Write' and 'Erase' because it exhibits an On/Off phenomena. Further, this memory device exhibits considerably stable memory characteristics in the two resistance states of On and Off. For example, when the memory device maintains On-state at a voltage of 2.0 V, current is about $1.0 \times 10^{-2}$ A, and when the memory device maintains the Off-state at a voltage of 2.0 V, current is about $1.0 \times 10^{-7}$ A, and thus the current ratio of On-state and Off-state is $10^5$-$10^6$.

The invention claimed is:

1. A polyimide polymer compound, represented by Formula (I) below:

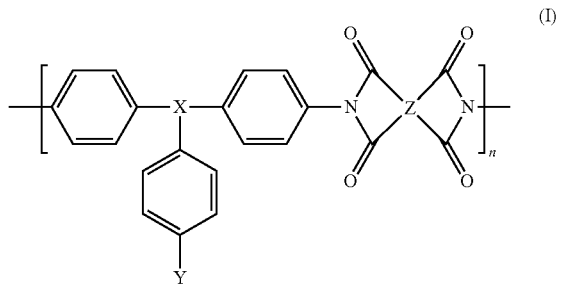

(I)

wherein X is —CH—, N or P, and Y is selected from the group consisting of the following derivatives:

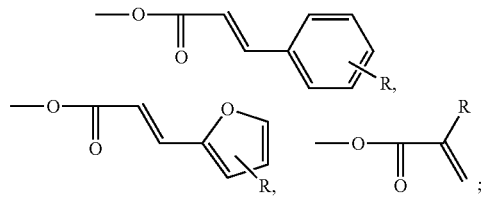

R is H or an alkyl group of 1 to 8 carbon atoms, and Z is any one selected from the group consisting of the following aromatic and aliphatic derivatives:

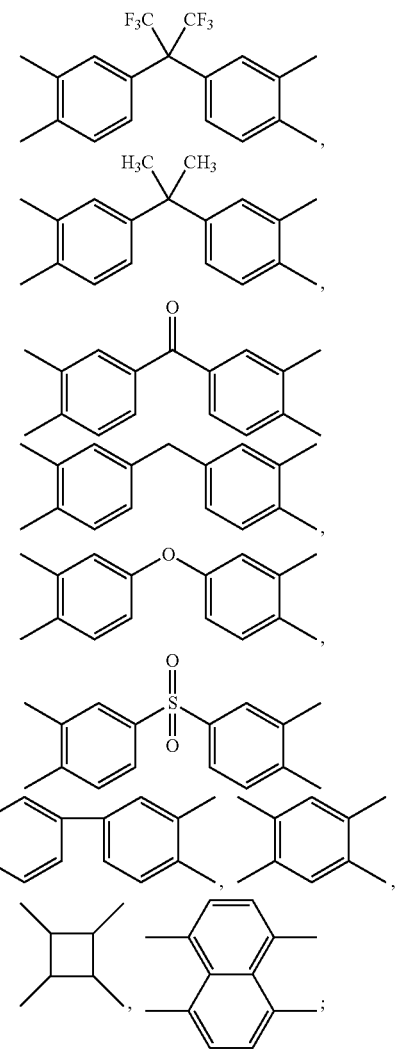

and n is a positive integer, and the polyimide polymer compound has a weight average molecular weight of 5,000 to 5,000,000.

2. The polyimide polymer compound of claim 1, wherein the polyimide polymer compound is a photocrosslinkable polymer compound.

3. A method of preparing a polymer compound by reacting a polymer compound represented by Formula (II) below with at least one selected from the following compounds (II-1):

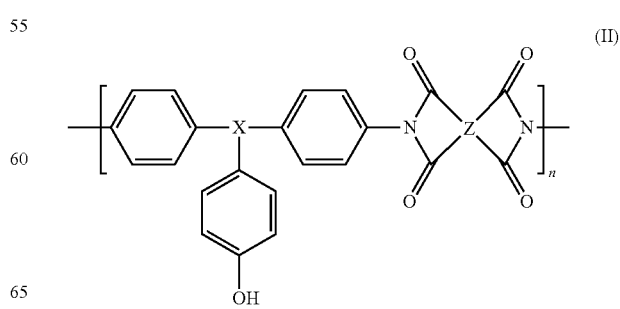

(II)

wherein X is —CH—, N or P, and Z is selected from the group consisting of the following derivatives:

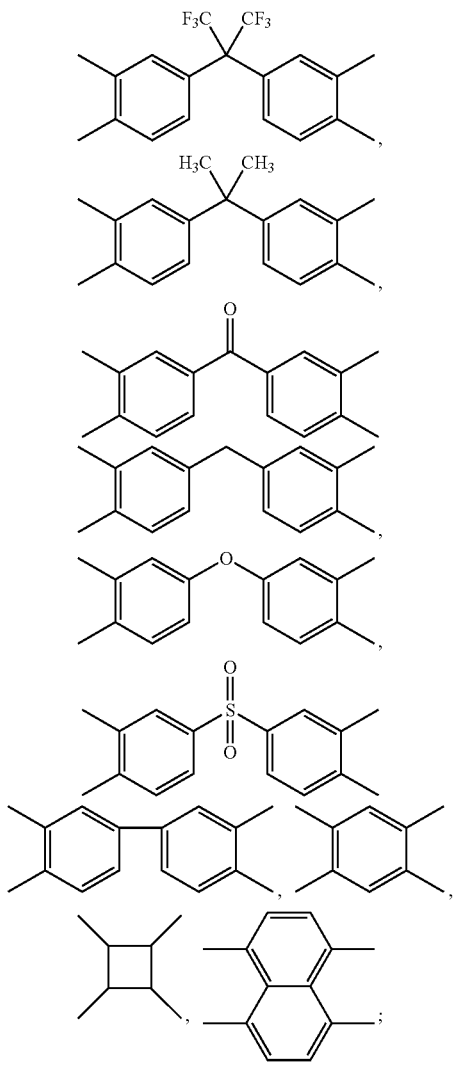

and
n is a positive integer (repetitive unit) of 10 to 10000, and

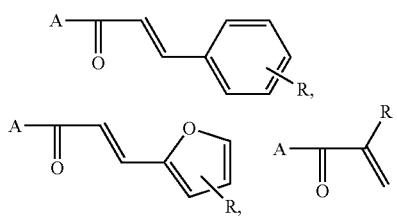
(II-1)

wherein R is hydrogen or an alkyl group of 1 to 8 carbon atoms, and A is halogen.

4. The method of claim 3, wherein the polymer compound represented by Formula (II) above is prepared by reacting a compound represented by Formula (III) below with a compound represented by Formula (IV) below:

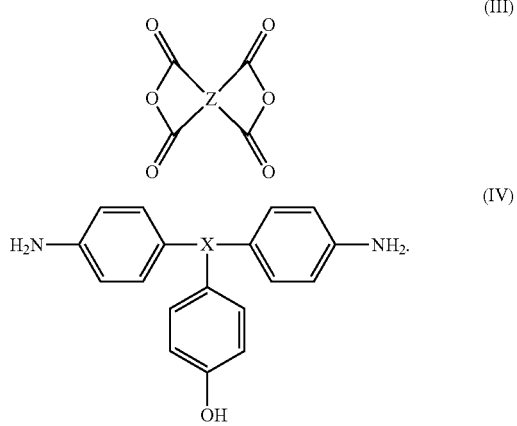

5. The method of claim 4, wherein the compound represented by Formula (IV) above is obtained by a reduction reaction of a dintro compound represented by Formula (V) in the presence of a palladium catalyst:

(V)

O₂N—⟨⟩—X—⟨⟩—NO₂.

|
OH

6. The method of claim 5, wherein the compound represented by Formula (V) above is prepared by reacting a compound represented by Formula (VI) with 4-fluoronitrobenzene under a cesium catalyst:

(VI)

XH₂
|
⟨⟩
|
Y wherein Y is selected from the group of the follows derivatives

[structures], —OH.

7. A polymer memory device, comprising an active layer obtained by crosslinking a polyimide polymer represented by Formula (I):

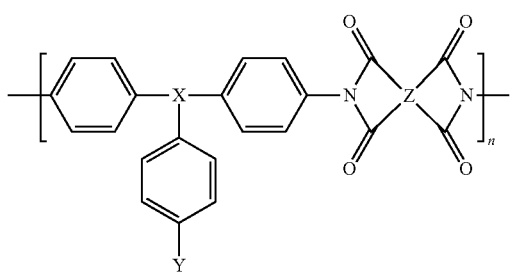

wherein X is —CH—, N or P, and Y is selected from the group consisting of the following derivatives:

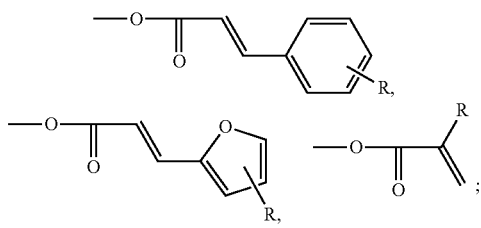

R is H or an alkyl group of 1 to 8 carbon atoms, and Z is any one selected from the group consisting of the following aromatic and aliphatic derivatives:

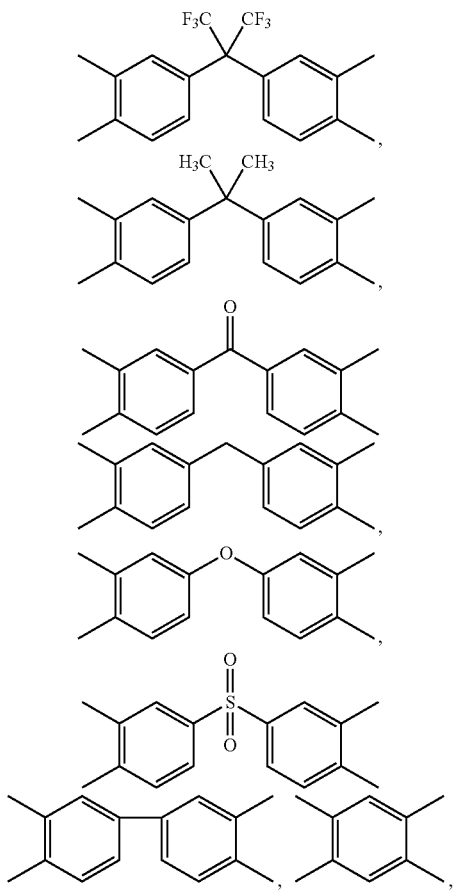

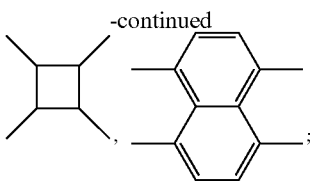

and n is a positive integer (repetitive unit), and the polyimide polymer compound has a weight average molecular weight of 5,000 to 5,000,000.

8. The polymer memory device of claim 7, wherein the polymer memory device comprises a first electrode, an active layer formed on the first electrode, and a second electrode formed on the active layer.

9. The polymer memory device of claim 8, wherein the first electrode is selected from the group consisting of gold, silver, platinum, copper, cobalt, nickel, tin, aluminum, indium-tin oxide, titanium, and combinations thereof.

10. The polymer memory device of claim 8, wherein the second electrode is selected from the group consisting of gold, silver, platinum, copper, cobalt, nickel, tin, aluminum, indium-tin oxide, titanium, and combinations thereof.

11. The polymer memory device of claim 7, wherein the active layer is connected to an electrode and a diode.

12. The polymer memory device of claim 11, wherein the diode is a P—N diode or a Schottky diode.

13. A method of manufacturing a polymer memory device, comprising the steps of:
   forming an active layer on a lower electrode formed on a substrate; and
   forming an upper electrode on the active layer such that the upper electrode is brought into contact with the active layer,
   wherein the active layer is formed by crosslinking a polyimide polymer compound represented by Formula (I) below:

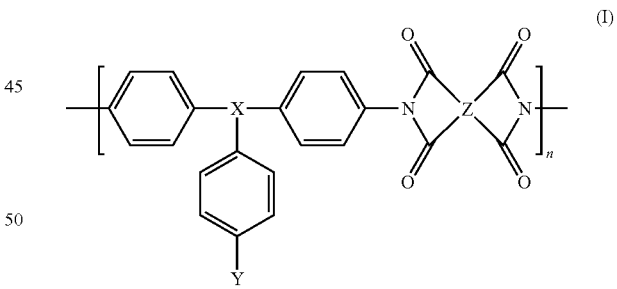

here, X is —CH—, N or P, and Y is selected from the group consisting of the following derivatives:

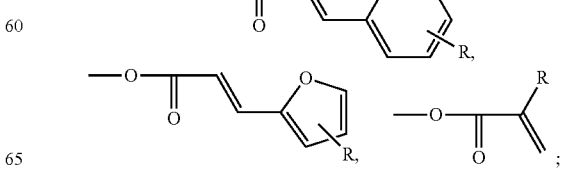

R is H or an alkyl group of 1 to 8 carbon atoms, and Z is any one selected from the group consisting of the following aromatic and aliphatic derivatives:

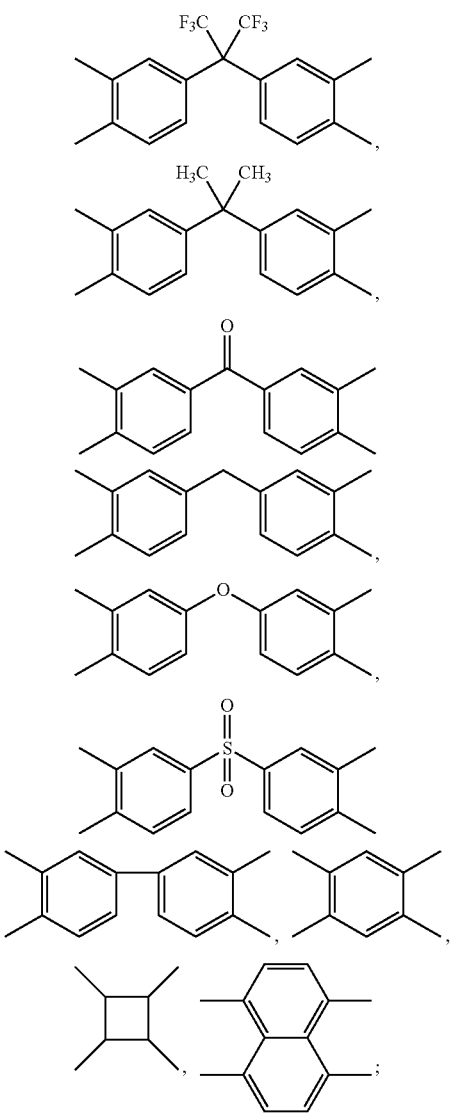

and n is a positive integer (repetitive unit), and the polyimide polymer compound has a weight average molecular weight of 5,000 to 5,000,000.

14. The method of claim 13, wherein, the step of forming the active layer is performed by coating the lower electrode with a polymer-containing solution.

15. The method of claim 14, wherein the coating is performed by any one of spin coating, spray coating, electrostatic coating, dip coating, blade coating, inkjet coating and roll coating.

16. The method of claim 15, wherein a nanopattern is formed by irradiating a coating layer with light to crosslink the coating layer.

17. A polyimide polymer compound, represented by Formula (I') below:

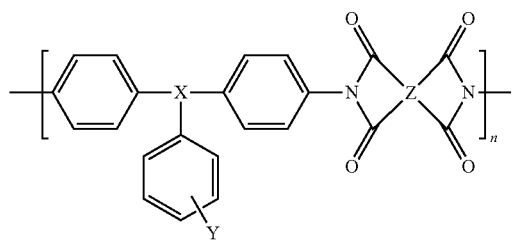

wherein X is —CH—, N or P, and Y is selected from the group consisting of the following derivatives:

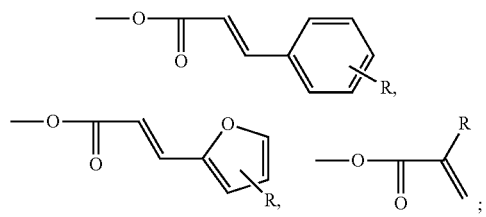

R is H or an alkyl group of 1 to 8 carbon atoms, and Z is any one selected from the group consisting of the following aromatic and aliphatic derivatives:

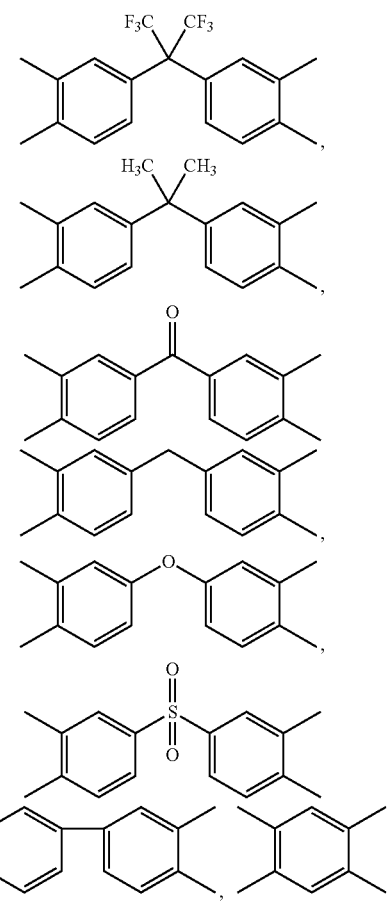

-continued
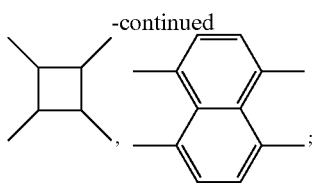
and
n is a positive integer (repetitive unit), and the polyimide polymer compound has a weight average molecular weight of 5,000 to 5,000,000.
18. The polyimide polymer compound of claim 17, wherein the polyimide polymer compound has a weight average molecular weight of 5,000 to 500,000.
* * * * *